(12) United States Patent
Koo et al.

(10) Patent No.: US 7,173,368 B2
(45) Date of Patent: Feb. 6, 2007

(54) FLAT PANEL DISPLAY WITH THIN FILM TRANSISTOR (TFT)

(75) Inventors: Jae-Bon Koo, Yongin (KR); Ji-Yong Park, Suwon (KR); Sang-Il Park, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 509 days.

(21) Appl. No.: 10/725,599

(22) Filed: Dec. 3, 2003

(65) Prior Publication Data

US 2004/0178410 A1   Sep. 16, 2004

(30) Foreign Application Priority Data

Mar. 13, 2003   (KR) ...................... 10-2003-0015855

(51) Int. Cl.
*H05B 33/00* (2006.01)
*H01L 29/04* (2006.01)

(52) U.S. Cl. ......................................... 313/498; 257/59
(58) Field of Classification Search ................ 313/498; 257/59, 72, 88–93
See application file for complete search history.

(56) References Cited

U.S. PATENT DOCUMENTS 6,876,001 B2 * 4/2005 Koo et al. .................. 257/72

FOREIGN PATENT DOCUMENTS

| JP | 5-107561 | 4/1993 |
|---|---|---|
| JP | 2001-109399 | 4/2001 |
| JP | 2001-290441 | 10/2001 |

\* cited by examiner

*Primary Examiner*—Joseph Williams
(74) *Attorney, Agent, or Firm*—HC Park & Associates, PLC

(57) ABSTRACT

A flat panel display which can adjust a white balance to a proper level according to the difference among the crystal grains of driving TFT active layers without changing the sizes of the driving TFT active layers. The flat panel display also can obtain an appropriate luminance by supplying an optimal amount of current to each sub-pixel. The flat panel display has a plurality of pixels. Each of the pixels includes a plurality of sub-pixels and each sub-pixel has a self-luminescent element and a driving thin film transistor. Each of the driving thin film transistors has a semiconductor active layer having a channel region is connected to the self-luminescent element of the corresponding sub-pixel in order to supply current to each of the self-luminescent elements. At least the channel regions of the semiconductor active layers have crystal grains of different sizes or shapes for different sub-pixels.

34 Claims, 6 Drawing Sheets

FLAT PANEL DISPLAY WITH THIN FILM TRANSISTOR (TFT)

CROSS REFERENCE TO RELATED APPLICATION

This application claims the priority of Korean Patent Application No. 2003-15855, filed on Mar. 13, 2003, in the Korean Intellectual Property Office, the disclosure of which is incorporated herein in its entirety by reference.

BACKGROUND OF THE INVENTION

1. Field of the Invention

The invention relates to an active matrix (AM)-type flat panel display including thin film transistors, and more particularly, to a flat panel display including active layers of thin film transistors formed of polycrystalline silicon, whose crystal grains have different sizes and shapes for different display pixels.

2. Description of the Related Art

Thin film transistors (TFTs) are used as switching units to control the operations of pixels or as driving units to drive pixels in flat panel displays, such as, liquid crystal displays (LCDs) or organic or inorganic electro-luminescent (EL) displays.

A thin film transistor generally has a semiconductor active layer, a gate insulating layer formed on the semiconductor active layer, and a gate electrode. The semiconductor active layer is formed on a substrate and has a drain region and a source region which are doped with impurities of a high concentration and a channel region formed between the drain and source regions. The gate electrode is formed on a portion of the gate insulating layer that is over the channel region of the semiconductor active layer. The semiconductor active layer can be either an amorphous silicon layer or a polycrystalline silicon layer.

Thin film transistors using amorphous silicon can be deposited at a low temperature, but have degraded electrical characteristics and low reliability. Thus, thin film transistors using amorphous silicon are not suitable for large-sized display devices. Hence, polycrystalline silicon thin film transistors are more commonly used. Since a polycrystalline silicon has a high mobility of several tens through several hundreds of $cm^2/V.s$, a low high-frequency operating characteristic, and a low current leakage value, the polycrystalline silicon is very suitable for use in large, high-definition flat panel displays.

As described above, thin film transistors are used as switching units or pixel driving units in flat panel displays. An AM-type organic EL display generally includes at least two thin film transistors (hereinafter, referred to as TFTs) for each sub-pixel.

An organic EL element generally has an organic luminescent layer between an anode and a cathode. In the organic EL element, as an anode voltage and a cathode voltage are applied to the anode and the cathode, respectively, holes introduced from the anode are transported to the organic luminescent layer via a hole transport layer, and electrons introduced from the cathode are transported to the organic luminescent layer via an electron transport layer. In the organic luminescent layer, the electrons and the holes are combined to produce exitons. As the excited state of the exitons is changed to a ground state, fluorescent molecules on the organic luminescent layer emit light to form an image. In full-color organic EL displays, pixels emitting three colors, generally, red (R), green (G), and blue (B), are included as the organic EL element to achieve a full-color display.

However, in such organic EL displays, R, G, and B luminescent layers emitting R, G, and B light, respectively, have different luminescent efficiency for colors. When the same current has been applied to each of R, G, and B pixels, some colors have low luminescence and some colors have high luminescence, according to the respective colors luminescent efficiency. Accordingly, achieving a proper color balance or white balance is difficult. For example, if the luminescent efficiency of the G luminescent layer is about 3 to 6 times higher than those of the R and B luminescent layers, a current which is about 3 to 6 times greater than a current for the G luminescent layer should be applied to the R and B luminescent layers in order to adjust the white balance to a proper level.

A conventional method of adjusting the white balance to a proper level as described above is disclosed in Japanese Patent Publication No. 5-107561, wherein different voltages supplied through a driving line, that is, different Vdd values, are applied to different pixels.

Japanese Patent Publication No. 2001-109399 discloses a method of adjusting a white balance by controlling the size of a driving TFT. More Specifically, when the width and length of a channel region in the driving TFT are W and L, respectively, different W/L ratios are applied to R, G, and B sub-pixels to thereby control the amounts of currents flowing into R, G, and B organic EL elements.

Japanese Patent Publication No. 2001-290441 discloses a method of adjusting a white balance by forming pixels of different colors to have different sizes. In this method, a green luminescent region with the highest luminescent efficiency is formed to have the smallest luminescent area compared to red and blue luminescent regions, thus achieving a proper white balance and a display device with a long life span. The difference in the luminescent area can be obtained by varying the anode area.

A method of adjusting luminescence by controlling the amount of current by applying different voltage ranges to R, G, and B color pixels via a data line is also known as a method of adjusting a white balance.

However, methods described above do not consider the crystal structure of a polycrystalline silicon TFT of a flat panel display. In other words, the crystal grains of a TFT active layer can have various shapes and sizes according to a crystallizing way, and the mobility of current may vary according to the shape and size of the crystal grains. In this case, the white balance cannot be adjusted even by using the above-described methods.

If the amount of current flowing into an organic EL element in each sub-pixel exceeds a limit value, luminescence per unit area is greatly increased by the amount of current. Accordingly, the life span of the organic EL elements rapidly decreases. Thus, to increase the life span of organic EL elements, an optimal amount of current has to be supplied to each sub-pixel.

SUMMARY OF THE INVENTION

The invention provides a flat panel display which can adjust a white balance to a proper level according to the difference among the crystal grains of driving TFT active layers.

The invention separately provides a flat panel display which can adjust a white balance to a proper level without changing the sizes of the driving TFT active layers, even when an identical driving voltage is applied.

The invention separately provides a flat panel display which obtains an appropriate luminance and prevents a reduction of its life span by supplying an optimal amount of current to each sub-pixel.

According to one aspect of the invention, there is provided a flat panel display that includes a plurality of pixels. Each of the pixels includes a plurality of sub-pixels and each sub-pixel have a self-luminescent element and a driving thin film transistor. Each of the driving thin film transistors has a semiconductor active layer having a channel region connected to the self-luminescent elements of the sub-pixel to which the driving transistor belongs in order to supply current to each of the self-luminescent element. At least the channel regions of the semiconductor active layers have different crystal grains for different sub-pixels.

In various embodiments of the invention, there are sub-pixels for at least two different colors.

In various embodiments of the invention, the channel regions have different crystal grains for the sub-pixels of different colors.

In various embodiments of the invention, the difference in the crystal grains between the channel regions is determined by a value of current flowing in each of the sub-pixels of different colors.

In various embodiments of the invention, the difference in the crystal grains between the channel regions is determined by a current mobility value of each of the channel regions.

In various embodiments of the invention, the difference in the crystal grains between the channel regions is determined by the size of the crystal grains of each of the channel region.

In various embodiments of the invention, the size of each of the crystal grains of each of the channel regions is proportional to a value of current flowing in each of the sub-pixels of different colors when a substantially identical driving voltage is applied to the sub-pixels of different colors.

In various embodiments of the invention, the size of each of the crystal grains of each of the channel regions is proportional to a current mobility value of each of the channel regions.

In various embodiments of the invention, the difference in the crystal grains between the channel regions is determined by the shape of the crystal grains of each of the channel regions.

In various embodiments of the invention, the shape of each of the crystal grains of each of the channel regions is determined so that at least the channel regions of sub-pixels in which the lowest current flow at an identical driving voltage have shapeless grain boundaries.

In various embodiments of the invention, the shape of each of the crystal grains of each of the channel regions is determined so that at least the channel regions of sub-pixels in which a higher current flows than the sub-pixels with the shapeless grain boundaries at an identical driving voltage have parallel primary grain boundaries in strips or in a rectangular shape and side grain boundaries of anisotropic grains extending approximately perpendicular to the primary grain boundaries and between adjacent primary grain boundaries.

In various embodiments of the invention, the shape of each of the crystal grains of each of the channel regions is determined so that at least the channel regions of sub-pixels in which the highest current flows at an identical driving voltage have parallel primary grain boundaries in strips and side grain boundaries of anisotropic grains extending approximately perpendicular to the primary grain boundaries and between adjacent primary grain boundaries.

In various embodiments of the invention, the shape of each of the crystal grains of each of the channel regions is determined so that at least the channel regions of sub-pixels having the lowest current mobility have shapeless grain boundaries.

In various embodiments of the invention, the shape of each of the crystal grains of each of the channel regions is determined so that at least the channel regions of sub-pixels with a current mobility higher than the sub-pixels having the shapeless grain boundaries have parallel primary grain boundaries in the shape of strips or in a rectangular shape and side grain boundaries of anisotropic grains extending approximately perpendicular to the primary grain boundaries and between adjacent primary grain boundaries.

In various embodiments of the invention, the shape of each of the crystal grains of each of the channel regions is determined so that at least the channel regions of sub-pixels with the highest current mobility have parallel primary grain boundaries in strips and side grain boundaries of anisotropic grains extending approximately perpendicular to the primary grain boundaries and between adjacent primary grain boundaries.

In another aspect of the invention, there is provided a flat panel display including a plurality of pixels, each pixel including red, green, and blue sub-pixels. Each sub-pixel has a self-luminescent element, and a driving thin film transistor. Each driving thin film transistor has a semiconductor active layer having a channel region connected to the self-luminescent element of the sub-pixel to which the driving transistor belongs in order to supply current to the self-luminescent elements. The channel regions of the semiconductor active layers have different crystal grains for the sub-pixels of different colors.

In various embodiments of the invention, the difference in the crystal grains between the channel regions is determined according to the size of each of the crystal grains of each of the channel regions.

In various embodiments of the invention, the size of each of the crystal grains of each of the channel regions is determined so that a current of a smallest value flows in the green sub-pixels.

In various embodiments of the invention, the size of each of the crystal grains of each of the channel regions is determined so that the value of current flowing in the sub-pixels decreases in the sequence of red, blue, and then green sub-pixels when an identical driving voltage is applied to the red, blue, and green sub-pixels.

In various embodiments of the invention, the size of each of the crystal grains of each of the channel regions is determined so that the channel regions of the semiconductor active layers of the green sub-pixels have the smallest mobility value.

In various embodiments of the invention, the size of each of the crystal grains of each of the channel regions is determined so that the mobility values of the channel regions of the sub-pixels decrease in the sequence of red, blue, and then green sub-pixels.

In various embodiments of the invention, the size of the crystal grains of each of the channel regions decreases in the sequence of red, blue, and then green sub-pixels.

In various embodiments of the invention, the difference in the crystal grains between the channel regions is determined by the shape of the crystal grains of each of the channel regions.

In various embodiments of the invention, the shape of each of the crystal grains of each of the channel regions is determined so that a current of a smallest value flows in the green sub-pixels.

In various embodiments of the invention, the shape of each of the crystal grains of each of the channel regions is determined so that the value of current flowing in the sub-pixels decreases in the sequence of red, blue, and then green sub-pixels when an identical driving voltage is applied to the red, blue, and green sub-pixels.

In various embodiments of the invention, the shape of each of the crystal grains of each of the channel regions is determined so that the channel regions of the semiconductor active layers of the green sub-pixels have the smallest mobility value.

In various embodiments of the invention, the shape of each of the crystal grains of each of the channel regions is determined so that the mobility values of the channel regions of the sub-pixels decrease in the sequence of red, blue, and then green sub-pixels.

In various embodiments of the invention, the crystal grains of at least the channel regions of red sub-pixels among all of the channel regions of the sub-pixels have parallel primary grain boundaries and side grain boundaries of anisotropic grains extending approximately perpendicular to the primary grain boundaries and between adjacent primary grain boundaries, and the primary grain boundaries are in the shape of strips perpendicular to the lengthwise of the active layers of the red sub-pixels.

In various embodiments of the invention, at least the channel regions of the green sub-pixels among the channel regions of all of the sub-pixels have shapeless grain boundaries.

In various embodiments of the invention, at least the channel regions of the blue sub-pixels among the channel regions of all of the sub-pixels have parallel primary grain boundaries in a rectangular shape and side grain boundaries of anisotropic grains extending approximately perpendicular to the primary grain boundaries and between adjacent primary grain boundaries.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Figure 1:
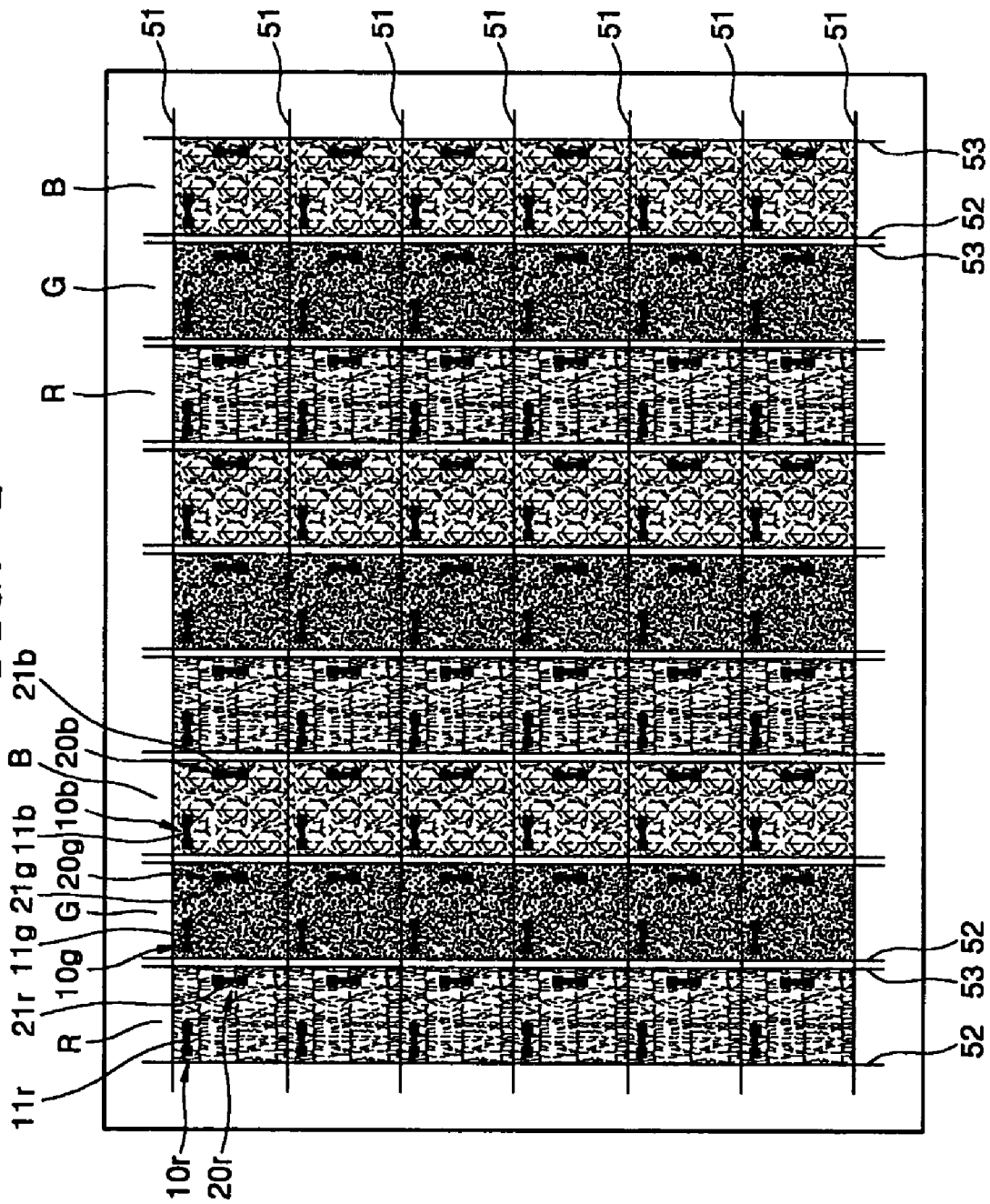
FIG. 1 is a plan view of a structure of a TFT active layer of an AM-type organic EL display according to a an exemplary embodiment of the invention.

FIG. 1 is a plan view of a structure of a TFT active layer of an AM-type organic EL display according to an exemplary embodiment of the invention. Referring to FIG. 1, the organic EL display includes a plurality of pixels, each of which is formed by repetitively arranging of a group of R, G, and B sub-pixels in a vertical direction. However, the present invention is not limited to the above sub-pixel arrangement. For example, sub-pixels of different colors can be arranged in various patterns, such as, a mosaic pattern or a lattice pattern to form a pixel. It should be understood by one of ordinary skill in the art that the sub-pixels can have at least two different colors.

In the organic EL display of FIG. 1, a plurality of gate lines 51 are arranged horizontally, and a plurality of data lines 52 are arranged vertically. Driving lines 53 for supplying power are also arranged vertically. A sub-pixel is defined by a gate line, a data line 52, and a driving line 53.

Each of the R, G, and B sub-pixels includes at least two TFTs, that is, a first thin film transistor (hereinafter, referred to as a first TFT) and a second thin film transistor (hereinafter, referred to as a second TFT). First TFTs 10r, 10g, and 10b can be switching TFTs for controlling the operations of organic EL elements using a signal via a gate line 51, and second TFTs 20r, 20g, and 20b can be driving TFTs for driving the organic EL elements. Of course, the number of TFTs and the arrangement of the TFTs can vary depending on the characteristics of a display, the type of a driving method, or the like.

The first TFTs 10r, 10g, and 10b have first semiconductor active layers 11r, 11g, and 11b, respectively, and the second TFTs 20r, 20g, and 20b have second semiconductor active layers 21r, 21g, and 21b, respectively. Each of these semiconductor active layers has a channel region (not shown), which will be described later. The channel region is located nearly at the center of each of the first semiconductor active layers 11r, 11g, and 11b, and the second semiconductor active layers 21r, 21g, and 21b, and is formed under a gate electrode so as to be insulated from the gate electrode.

In organic EL displays, second semiconductor active layers, which constitute a driving TFT, can be formed to have different crystal grains for different sub-pixels. In the exemplary embodiment of the invention of FIG. 1, the second semiconductor active layers can be formed to have crystal grains with different shapes for different colors. In other words, the second semiconductor active layers 21r, which constitute a red pixel (R), the second semiconductor active layers 21g, which constitute a green pixel (G), and the second semiconductor active layers 21b, which constitute a blue pixel (B), have crystal grains with different shapes for pixels of different colors. If the R, G, and B sub-pixels are arranged in a lattice pattern instead of strips, as shown in FIG. 1, the second semiconductor active layers are arranged in different directions while keeping the lattice pattern. If the sub-pixels have colors other than red, green, and blue, the second semiconductor active layers are still arranged in different shapes for different colors.

The first semiconductor active layers 11r, 11g, and 11b and the second semiconductor active layers 21r, 21g, and 21b may be formed of thin polycrystalline silicon. As shown in FIG. 1, at least the second semiconductor active layers 21r, 21g, and 21b have crystal grains of different shapes for R, G, and B pixels. More specifically, only the channel regions of the second semiconductor active layers 21r, 21g, and 21b can have differently shaped crystal grains. However, FIG. 1 shows differently shaped crystal grains of the second semiconductor active layers in their entirety, more specifically, differently shaped crystal grains of sub-pixels in their entirety for different colors, in order to avoid a complicated drawing. In exemplary embodiments of the invention described below, individual sub-pixels have different types of crystal grains. However, the present invention is not limited to theses embodiments, and the first semiconductor active layers 11r, 11g, and 11b may have the same crystal structure.

According to an exemplary embodiments of the invention, as the channel regions of second semiconductor active layers of the second TFTs, which are used as driving TFTs, have differently shaped crystal grains for R, G, and B sub-pixels, the semiconductor active layers can have the same size, and a white balance can be obtained even when an identical driving voltage is applied to the R, G, and B sub-pixels. This principle will be described below in greater detail.

As described above, in organic EL displays, the luminescent layers of the R, G, and B sub-pixels have different luminescent efficiency and accordingly provide different luminescence values. Hence, a white balance cannot be obtained when a substantially identical current is applied to all three luminescent layers. Table 1 shows the luminescent efficiency of R, G, and B organic luminescent layers, which are widely used in current organic EL displays, and the current amounts to be applied to R, G, and B sub-pixels in order to obtain a white balance.

TABLE 1

|  | Red | Green | Blue |
| --- | --- | --- | --- |
| Efficiency (Cd/A) | 6.72 | 23.37 | 4.21 |
| Sub-pixel current (μA) | 0.276 | 0.079 | 0.230 |
| Sub-pixel current ratio | 3.5 | 1 | 2.9 |

As can be seen from Table 1, to achieve a white balance, the smallest amount of current is applied to green sub-pixels, followed by a current value for blue sub-pixels. The greatest amount of current is applied to red sub-pixels.

The difference in current value can be obtained by differentiating the shapes of crystal grains of the second semiconductor active layers 21r, 21g, and 21b of the second TFTs 20r, 20g, and 20b of FIG. 1, which are driving TFTs for supplying current to luminescent elements. In other words, due to the formation of the second semiconductor active layers 21r, 21g, and 21b of the second TFTs 20r, 20g, and 20b to have crystal grains of different shapes, different values of current should be applied to luminescent elements (for example, organic EL elements) of R, G, and B sub-pixels.

The shapes of the crystal grains of the second semiconductor active layers 21r, 21g, and 21b of the second TFTs 20r, 20g, and 20b are determined by the values of currents flowing in the organic EL elements of the sub-pixels at an identical driving voltage. Hence, to obtain a white balance, the active layers 21g of the second TFTs 20g in green sub-pixels should be arranged in a direction that enables a current of the lowest amount to be applied to the organic EL elements of the green sub-pixels with the greatest luminance. The shapes of the crystal grains of the second active layers 21r, 21g, and 21b of the second TFTs 20r, 20g, and 20b are controlled so that the current amounts applied to the organic EL elements of the sub-pixels decrease in the order of R sub-pixels, B sub-pixels, and then G sub-pixels. In other words, the shape of the crystal grains of the second active layers 21r is determined so that a current of the greatest amount can be applied to the organic EL elements of red sub-pixels, the shape of the crystal grains of the second active layers 21b are determined so that a current of the second greatest amount can be applied to the organic EL elements of the blue sub-pixels, and the shape of the crystal grains of the second active layers 21g are determined so that a current of the smallest amount can be applied to the organic EL elements of green sub-pixels. Accordingly, the luminance of each of the R, G, and B sub-pixels is compensated for so that the white balance can be adjusted to a proper level.

The shapes of the crystal grains of the second active layers 21r, 21g, and 21b of the second TFTs 20r, 20g, and 20b can also be determined according to the mobility of the channel regions of the active layers. This is because a large current flows in the channel region when a channel region has a high mobility, and a small current flows in the channel region when a channel region has a low mobility.

Hence, to obtain a white balance, the active layers 21g of the second TFTs 20g in green sub-pixels should have crystal grains with a shape that enables the green sub-pixels with the greatest luminance to have the lowest current mobility. Preferably, the shape of the crystal grains of each of the active layers 21r, 21g, and 21b of the second TFTs 20r, 20g, and 20b is controlled so that the current mobility of a channel region of an active layer of a second TFT in each sub-pixel decreases in the order of R, B, and then G sub-pixels. In other words, the shape of the second active layers 21r is determined so that their channel regions have the greatest current mobility, the shape of the second active layers 21b is determined so that their channel regions have the second greatest mobility, and the shape of the second active layers 21g is determined so that their channel regions have the smallest mobility. Accordingly, currents of different values flow in the organic EL elements of the R, G, and B sub-pixels as described above, and the luminance of each of the R, G, and B sub-pixels is compensated for. Thus, the white balance can be adjusted to a proper level.

The difference in current value and the difference in current mobility can vary according to the crystal structure of polycrystalline silicon of which active layers are formed. Different current values and different mobility for R, G, and B sub-pixels can be obtained by forming the active layers in R, G, and B sub-pixels on a polycrystalline silicon thin film having different crystal structures.

Figure 2:
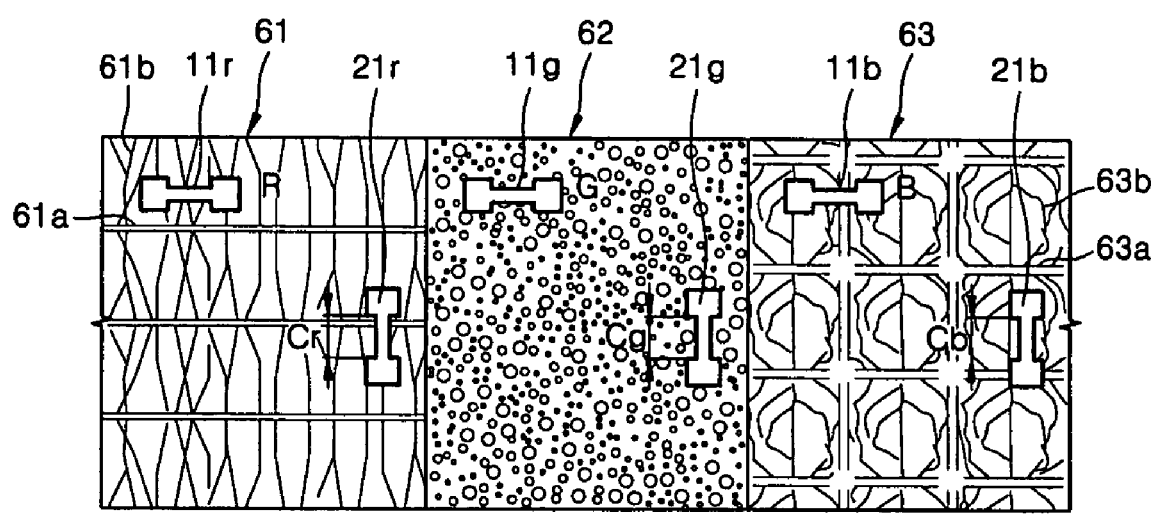
FIG. 2 is a plan view of one embodiment of a polycrystalline silicon thin film in which TFT active layers are formed in each sub-pixel.

As shown in FIG. 2, in an exemplary embodiment of the present invention, a polycrystalline silicon thin film is obtained by solidifying an amorphous silicon thin film using a well-known sequential lateral solidification method (hereinafter, referred to as an SLS method). The channel regions of the second semiconductor active layers of the second TFT in individual sub-pixels can have different crystal shapes by making pixels of different colors have different crystal shapes. The SLS method is based on the fact that silicon grains grow on the boundary between a liquid portion of silicon and a solid portion of silicon in a direction perpendicular to the boundary surface. In the SLS method, amorphous silicon is partially melted by projecting a laser beam onto a mask that covers the amorphous silicon, and a melted silicon portion grows from the boundary between the melted silicon portion and a not-melted silicon portion and is then solidified.

Figure 3:
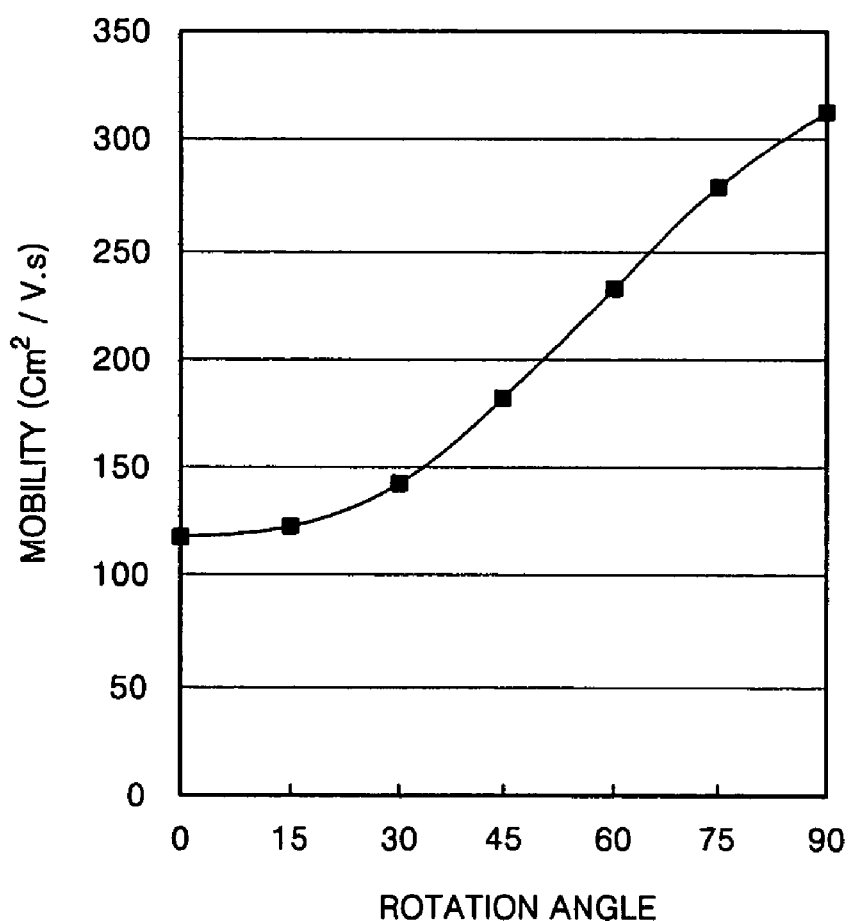
FIG. 3 is a graph showing a relationship between a direction of an active layer and a mobility of a channel region.

Crystal structures as shown in FIG. 2 can be obtained by using different masks for different pixels in the SLS method. A crystal structure 61 of an R sub-pixel comprises a plurality of primary grain boundaries 61a, which are straight lines parallel to one another, and a plurality of side grain boundaries of anistropic grains 61b, which are formed in a direction approximately perpendicular to the primary grain boundaries 61a. The crystal structure 61 is obtained by melting amorphous silicon using a mask with a striped laser beam transmission area and then solidifying the amorphous silicon melted in a stripe shape. If an active layer of a TFT is formed on the crystal structure 61, a variation of the current mobility of FIG. 3 can be obtained according to the angle formed by a channel region of the active layer and each of the primary grain boundaries 61a. The angle is determined by the direction of current flow in the channel region and the primary grain boundary. When the channel region of the active layer is perpendicular to the primary grain boundaries 61a, a current mobility of the greatest value is obtained. When the channel region of the active layer is parallel to the primary grain boundaries 61a, a current mobility of the lowest value is obtained. Hence, a channel region Cr of the second active layer 21r of the R sub-pixel is disposed perpendicular to the primary grain boundaries 61a so that a current mobility of the greatest value is obtained.

A crystal structure 62 of a G sub-pixel is a shapeless crystal structure having tiny crystal grains. The shapeless crystal structure 62 is obtained using a flood radiation technique in an SLS method, in which a plurality of crystal nucleuses are formed by laser projection without masks and grow to obtain fine, dense crystal grains. As shown in FIG. 2, if the second active layer 21g of the second TFT is formed on the shapeless crystal structure 62, a current mobility lower than the current mobility of the crystal structure 61 can be obtained.

A crystal structure 63 of a B sub-pixel has nearly-rectangular primary grain boundaries 63a, which can be formed in an SLS method by using a mask having a mixture of a striped laser beam transmission area with a dotted laser beam blocking area. As shown in FIG. 2, if the second active layer 21b of the second TFT is formed on the rectangular crystal structure 63, a current mobility of a value in between the current mobility values of the crystal structures 61 and 62 can be obtained.

Figure 4:
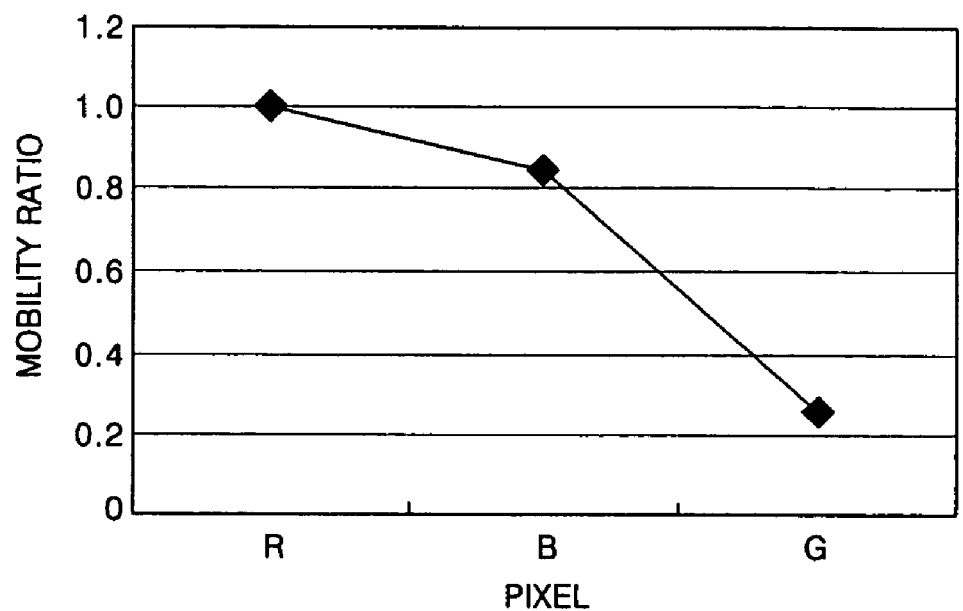
FIG. 4 is a graph showing mobility ratios of the TFT active layers of FIG. 2.

As described above, when R, G, and B sub-pixels have different crystal structures, and the second active layers 21r, 21g, and 21b are formed on the different crystal structures, they have different current mobility. Hence, current values for the R, G, and B sub-pixels at the same driving voltage are different, and the different current values are controlled to achieve a white balance. In other words, as shown in FIG. 4, current mobility ratios for the R, G, and B sub-pixels are different, and the R sub-pixel having a striped crystal structure has a current mobility value approximately five times greater than the G sub-pixel having a shapeless crystal structure. The B sub-pixel having a rectangular crystal structure has a current mobility value approximately 3 times greater than the G sub-pixel having the shapeless crystal structure. Accordingly, different current mobility ratios required to achieve a white balance can be obtained by only changing a crystal structure.

Figure 5:
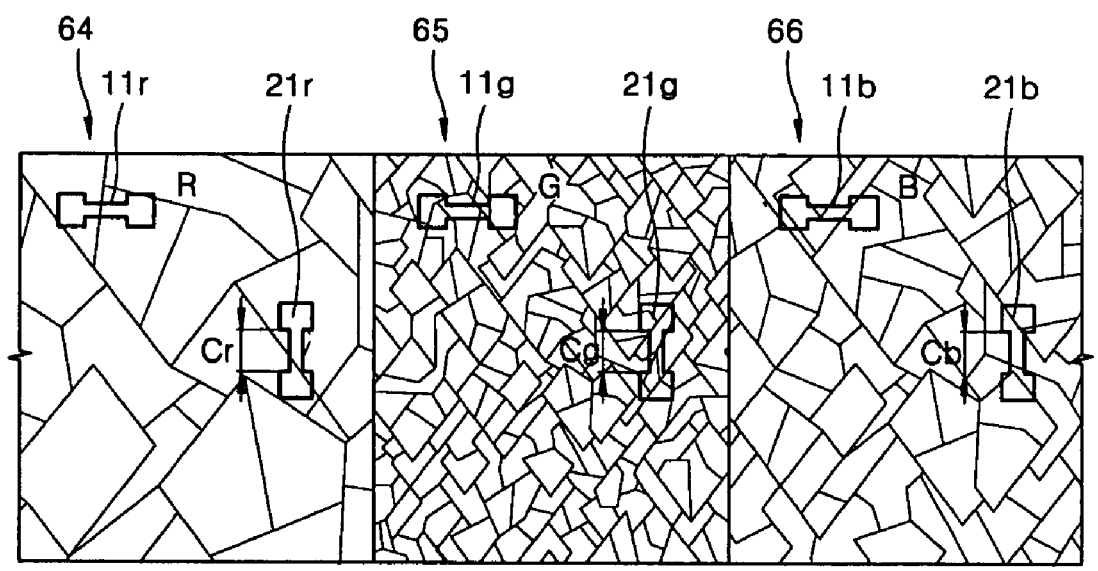
FIG. 5 is a plan view of another embodiment of a polycrystalline silicon thin film in which TFT active layers are formed in each sub-pixel.

Such an effect can also be obtained by differentiating the size of the crystal grains that form at least a channel region of an active layer of each sub-pixel as shown in FIG. 5. In another exemplary embodiment of the invention shown in FIG. 5, a polycrystalline silicon thin film is formed according to an excimer laser annealing (hereinafter, referred to as ELA) method. Crystal grains of different sizes for individual sub-pixels can be formed by projecting different energies onto different pixels.

Figure 6:
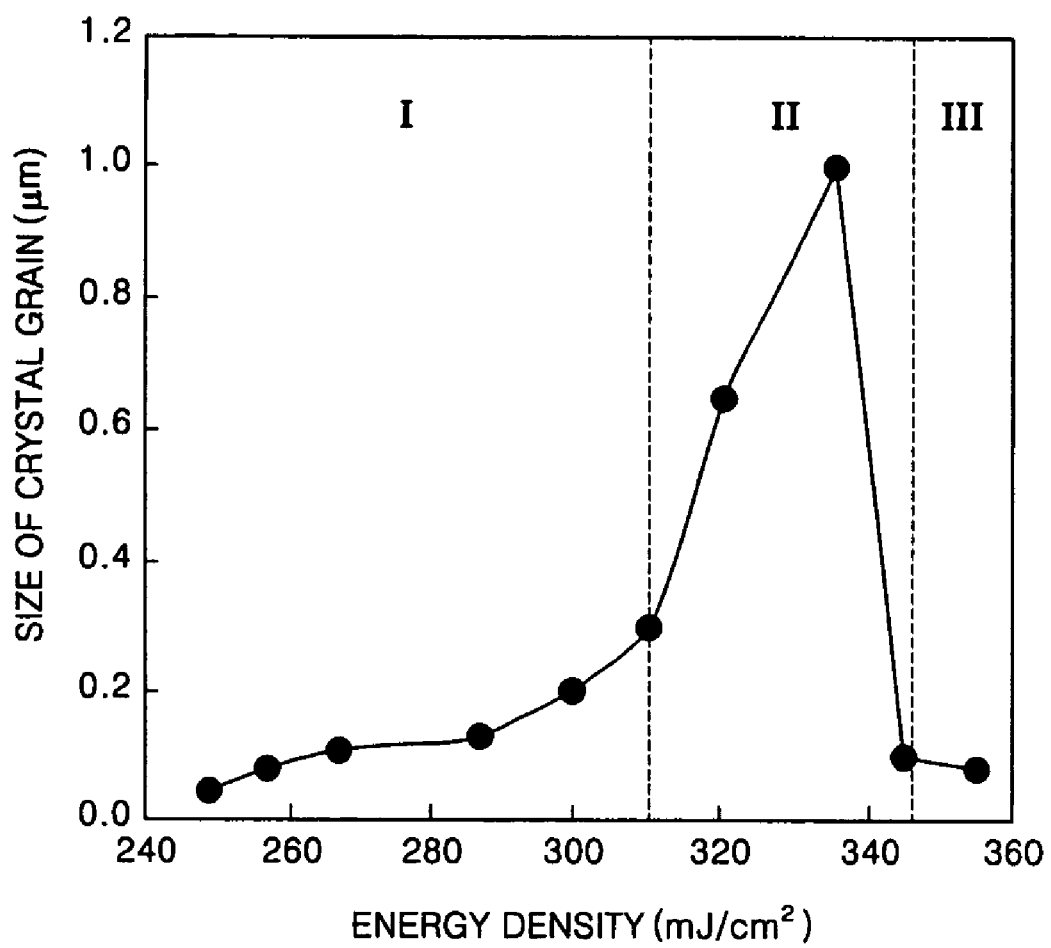
FIG. 6 is a graph showing a relationship between the size of crystal grains and an energy density when excimer laser annealing (ELA) is performed.

In the ELA method, as shown in FIG. 6, crystal grains have different sizes according to the energy density of projected laser. FIG. 6 shows different grain sizes obtained according to the energy density of projected laser when a 500 Å amorphous silicon thin film is crystallized using the ELA method.

As shown in FIG. 6, Region I denotes a region where amorphous silicon partially melts due to projection of laser with a low energy density. In Region I, because of partial melting of amorphous silicon, crystal grains grow vertically, and accordingly they are small.

Region II denotes a region where amorphous silicon nearly completely melts due to projection of laser with an energy density higher than the energy density for Region I. In Region II, crystal grains grow horizontally from a small number of not-melted solid crystal nucleuses, and accordingly they are large.

Region III denotes a region where amorphous silicon completely melts due to projection of laser with the highest energy density. In Region III, a large number of crystal nucleuses are produced by super-cooling, and fine crystal grains grow therefrom.

Figure 7:
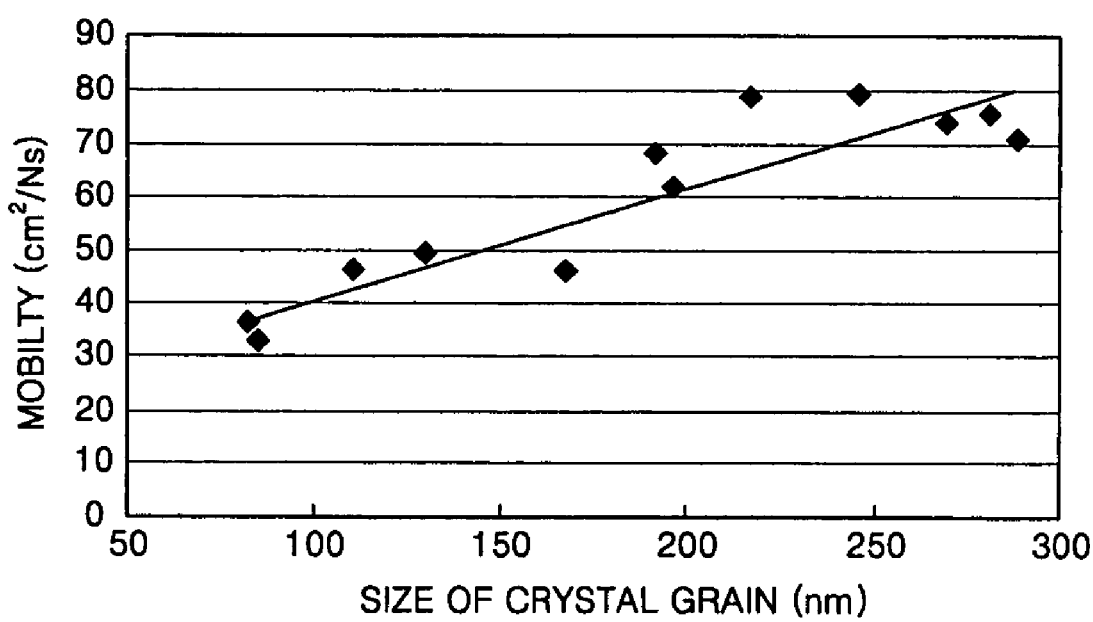
FIG. 7 is a graph showing a relationship between the size of crystal grains and the mobility of current.

If crystal grains have different sizes for individual sub-pixels, current mobility values for individual sub-pixels are also different. In other words, as shown in FIG. 7, as the size of crystal grains increases, the current mobility increases. Accordingly, a nearly straight-line relationship is established between the size of crystal grains and the current mobility.

Referring to FIGS. 6 and 7, in Region II, where the largest crystal grains are produced, the greatest current mobility can be obtained. In Region III, where the smallest crystal grains are produced, the smallest current mobility can be obtained.

Hence, as shown in FIG. 5, a crystal structure 64 of R sub-pixels has the largest crystal grains due to crystallization in Region II of FIG. 6 so as to obtain the greatest current mobility.

A crystal structure 65 of G sub-pixels has the smallest crystal grains due to crystallization in Region III of FIG. 6 so as to obtain the lowest current mobility. A crystal structure 66 of B sub-pixels is obtained by crystallizing amorphous silicon using laser with an energy density ranging in between Regions I and II of FIG. 6 in order to obtain a current mobility in between the current mobility values of R and G sub-pixels.

As described above, when R, G, and B sub-pixels have crystal grains of different sizes for different colors, and the second active layers 21r, 21g, and 21b are formed to have crystal grains of different sizes for different colors, the second active layers 21r, 21g, and 21b have different current mobility. Hence, the current values for R, G, and B sub-pixels at the same driving voltage are different, and the different current values for R, G, and B sub-pixels are controlled to achieve a white balance.

In the exemplary embodiment of the invention shown in FIG. 5, sub-pixels have different types of crystal grains.

However, as described above, the first active layers 11r, 11g, and 11b of R, G, and B sub-pixels may have a substantially identical crystal structure with high current mobility, while the second active layers 21r, 21g, and 21b, which constitute a driving TFT, may have different crystal structures with differently sized grains.

Each sub-pixel of an organic EL display as described above generally has a structure shown in FIGS. 8 through 11.

Figure 8:
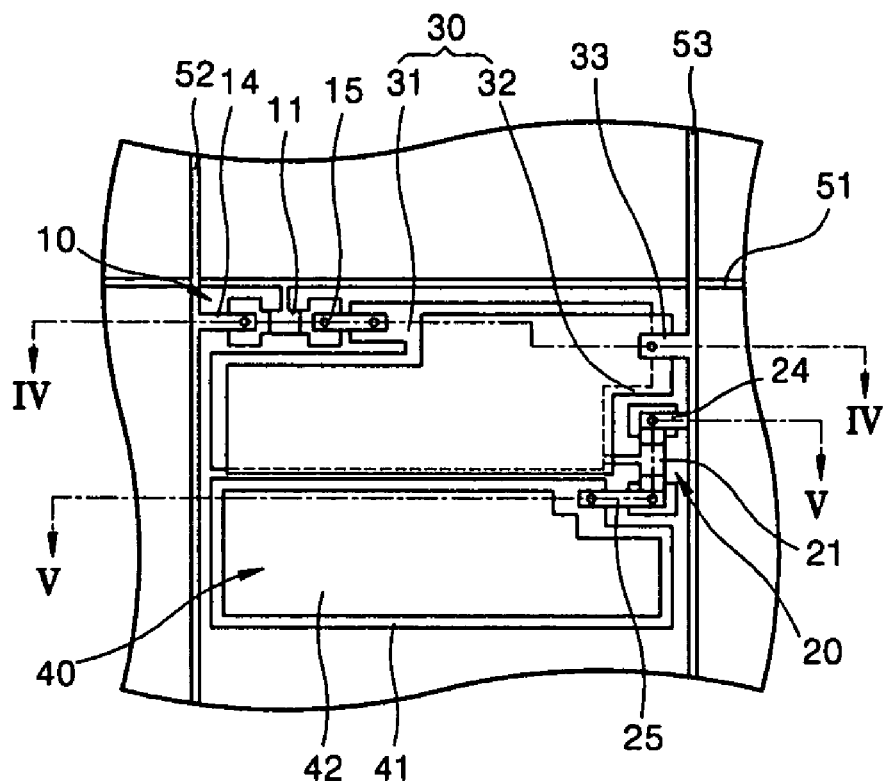
FIG. 8 is a partially magnified plan view of a sub-pixel of FIG. 1.
Figure 9:
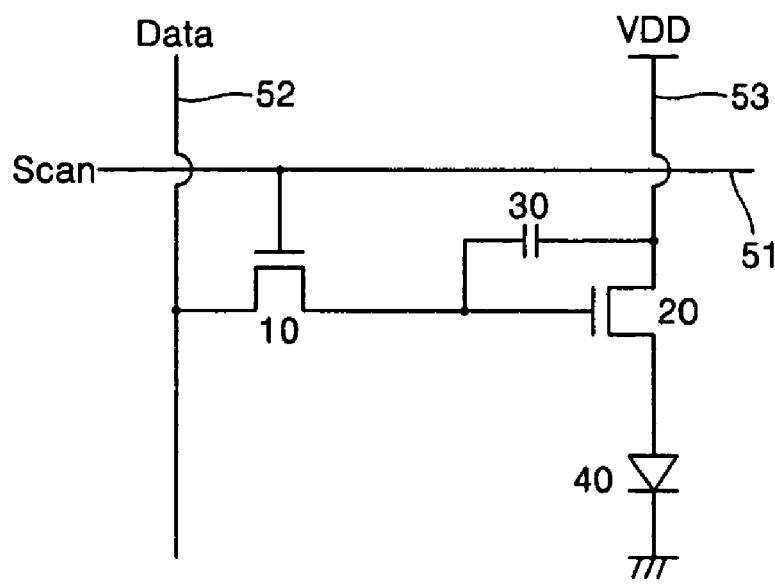
FIG. 9 is an equivalent circuit diagram of the sub-pixel of FIG. 8.

FIG. 8 shows a sub-pixel among the sub-pixels of FIGS. 1, 2, and 5. Hence, the sub-pixel of FIG. 8 does not denote a specific sub-pixel but any unspecified sub-pixel to which the invention can be applied. The reference numerals of FIG. 8 also indicate elements associated with an unspecified sub-pixel. FIG. 9 is an equivalent circuit diagram of an unspecified sub-pixel of FIG. 8.

Referring to FIG. 8, each of the sub-pixels of an AM-type organic EL display according to an exemplary embodiment of the invention has at least two TFTs, such as, a first TFT 10 for use as a switching unit and a second TFT 20 for use as a driving unit, a capacitor 30, and an organic EL element 40 (hereinafter, referred to as "EL element"). The number of TFTs and the number of capacitors are not limited to the case of FIG. 8. A greater number of TFTs and capacitors than the two TFTs and one capacitor may be included.

The first TFT 10 is driven in response to a scan signal applied to a gate line 51 and transmits a data signal, which is applied to a data line 52, to the second TFT 20 and the capacitor 30. The second TFT 20 determines the amount of current flowing into the EL element 40, using the data signal received through the first TFT 10, that is, a voltage difference Vgs between a gate and a source. The capacitor 30 stores the data signal received through the first TFT 10, for a period of one frame.

Figure 10:
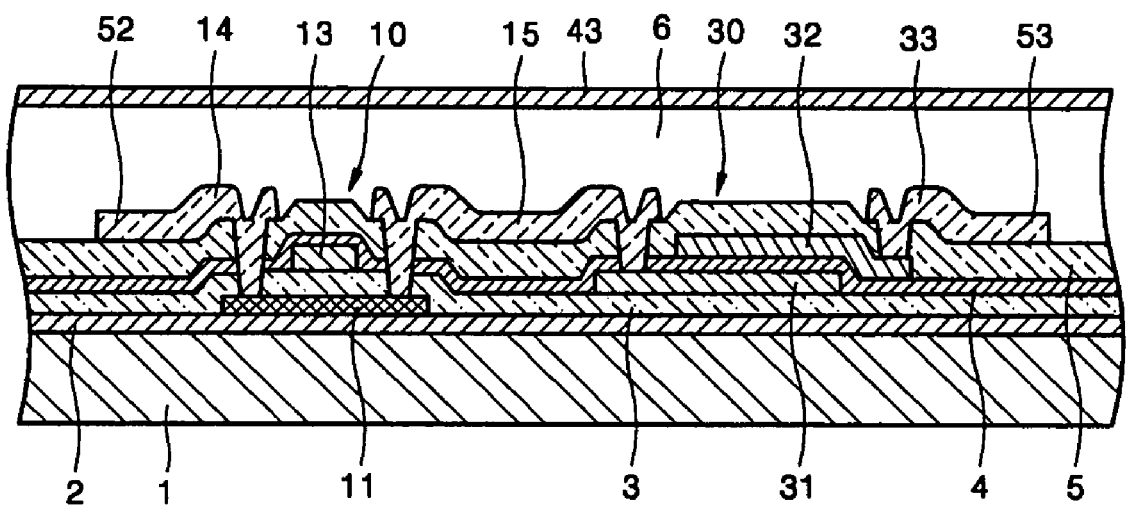
FIG. 10 is a cross-section taken along line IV—IV of FIG. 8.
Figure 11:
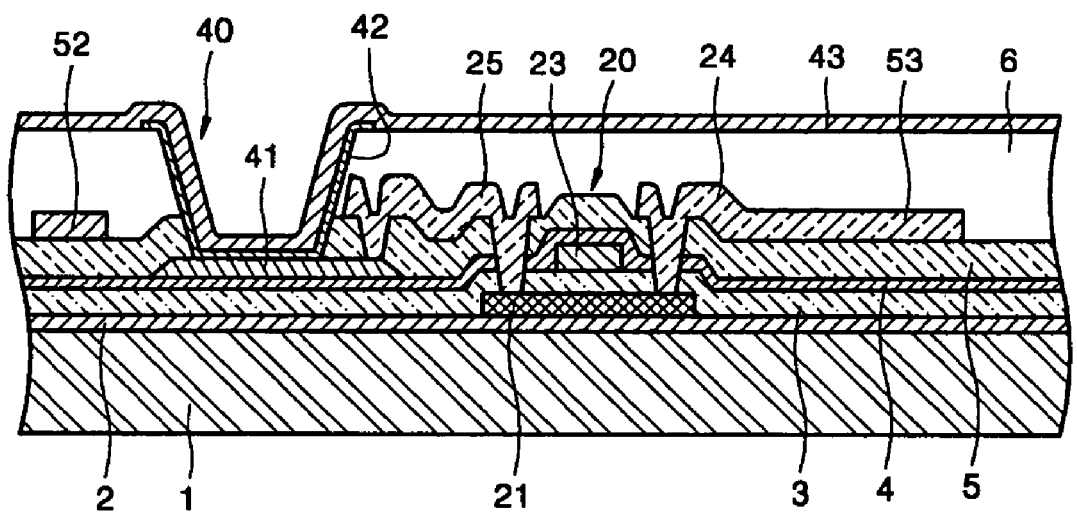
FIG. 11 is a cross-section taken along line V—V of FIG. 8.

An organic EL display having such a structure as shown in FIGS. 8, 10, and 11 is formed to achieve the circuit of FIG. 9. The structure of the organic EL display will be described below in detail.

As can be seen from FIGS. 8, 10, and 11, a buffer layer 2 is formed on an insulating substrate 1 formed of glass, and the first and second TFTs 10 and 20, the capacitor 30, and the EL element 40 are installed over the buffer layer 2.

As shown in FIGS. 8 and 10, the first TFT 10 is made up of a first active layer 11, a gate electrode 13, a source electrode 14, and a drain electrode 15. The gate electrode 13 is connected to the gate line 51 and receives a TFT on/off signal via the gate line 51 and outputs the same. The source electrode 14 is located above the gate electrode 13, connected to the data line 52, and supplies a data signal to the first active layer 11. The drain electrode 15 connects the first TFT 10 to the capacitor 30 to supply the data signal to the capacitor 30. A gate insulating layer 3 is formed between the first active layer 11 and the gate electrode 13.

The capacitor 30 for charging is located between the first and second TFTs 10 and 20 and stores the amount of driving voltage necessary to drive the second TFT 20, for a period of one frame. As can be seen from FIGS. 8 and 10, the capacitor 30 can be made up of first and second electrodes 31 and 32 and an inter-insulating layer 4. The first electrode 31 is connected to the drain electrode 15 of the first TFT 10. The second electrode 32 overlaps the first electrode 31 and is electrically connected to a driving line 53, which is a power applying line. The inter-insulating layer 4 is formed between the first and second electrodes 31 and 32 and is used as a dielectric layer. The structure of the charging capacitor 30 is not limited to the structure shown in FIG. 10. For example, a silicon thin film for the TFT 10 and a conductive layer of the gate electrode 13 can be used as the first and second electrodes 31 and 32, respectively, and the gate insulating layer 3 can be used as a dielectric layer. Various other methods can also be used.

As can be seen from FIGS. 8 and 11, the second TFT 20 is made up of a second active layer 21, a gate electrode 23, a source electrode 24, and a drain electrode 25. The gate electrode 23 is connected to the first electrode 31 of the capacitor 30 and receives a TFT on/off signal via the first electrode 31 and outputs the same. The source electrode 24 is located above the gate electrode 23, connected to the driving line 53, and supplies a reference driving voltage to the second active layer 21. The drain electrode 25 connects the second TFT 20 to the EL element 40 to supply driving power to the EL element 40. The gate insulating layer 3 is formed between the second active layer 21 and the gate electrode 23. As described above, depending on the color of sub-pixels, the channel region of the second active layer 21 may have different shapes or sizes of crystal grains.

The EL element 40 displays predetermined image data by emitting R, G, and B light as current flows. As can be seen from FIGS. 8 and 11, the EL element 40 is made up of an anode 41, a cathode 43, and an organic EL film 42. The anode 41 is connected to the drain electrode 25 of the second TFT 20 and receives positive power from the drain electrode 25. The cathode electrode 43 man cover the entire body of a pixel and supply negative power to the pixel. The organic EL film 42 is located between the anode 42 and the cathode 43 and emits light. Reference numeral 5 denotes an insulative passivation film formed of $SiO_2$ or the like, and reference numeral 6 denotes an insulative planarization film formed of acryl or the like.

The invention is not limited to the layer structure of the organic EL display shown in FIGS. 8, 10, and 11, and other layer structures can be applied to an organic EL display according to the present invention.

In such organic EL displays, at least the channel regions of second active layers of second TFTs have grains of different sizes or shapes for sub-pixels of different colors, and accordingly, sub-pixels of different colors have different current mobility. Thus, currents of different values flow in the different color sub-pixels at the same driving voltage, thereby adjusting a white balance. Furthermore, because current of a suitable value can be supplied to the EL element of each sub-pixel, the durability of the organic EL displays can be improved.

The organic EL display having the above-described structure can be manufactured in the following method.

First, as shown in FIGS. 10 and 11, the buffer layer 2 is formed on the insulating substrate 1. The buffer layer 2 can be formed, for example, of $SiO_2$ to a thickness of about 3000 Å by PECVD, APCVD, LPCVD, ECR, or the like.

An amorphous silicon thin film is deposited on the buffer layer 2, for example, to a thickness of about 500 Å. The amorphous silicon thin film can be solidified into a polycrystalline silicon thin film using various methods. As shown in FIG. 2 or 5, the polycrystalline silicon thin film has different crystal structures for sub-pixels of different colors. More specifically, the second active layers of second TFTs of sub-pixels have different crystal structures for each sub-pixel.

As described above, a polycrystalline silicon thin film as shown in FIG. 2 is produced by SLS using different types of masks so that the R sub-pixel has the striped crystal structure 61 having the primary and side grain boundaries of anisotropic grains 61a and 61b, the G sub-pixel has the shapeless crystal structure 62, and the B sub-pixel has the rectangular crystal structure 63 having the rectangular primary grain boundaries 63a. Also, a polycrystalline silicon thin film as shown in FIG. 5 is produced using the ELA method by projecting a laser beam with different energy densities, as shown in FIG. 6, so that the R sub-pixel has the crystal structure 64 with the largest crystal grains, the G sub-pixel has the crystal structure 65 with the smallest crystal grains, and the B sub-pixel has the crystal structure 66 with crystal grains of a size between the grain sizes of the R and G sub-pixels.

After such a polycrystalline silicon thin film is formed, the first active layers 11r, 11g, and 11b of the first TFTs 10r, 10g, and 10 and the second active layers 21r, 21g, and 21b of the second TFTs 20r, 20g, and 20b are patterned in sub-pixels of different colors as shown in FIGS. 2 and 5.

Thereafter, the gate insulating layer 3 is formed of SiO2 on the patterned active layers 11r, 11g, 11b, 21r, 21g, and 21b by PECVD, APCVD, LPCVD, ECR, or the like. Then, a conductive film is formed of MoW, Al/Cu, or the like and then patterned, thereby forming gate electrodes 13 and 23. The active layers 11r, 11g, 11b, 21r, 21g, and 21b, the gate insulating layer 3, and the gate electrodes 13 and 23 can be patterned in various sequences and methods.

After the patterning of the active layers, the gate insulating layer, and the gate electrodes, their source and drain regions are doped with N- or P-type impurities.

Thereafter, as shown in FIGS. 10 and 11, the inter-insulating layer 4 and the passivation film 5 are formed, the source electrodes 14 and 24 and the drain electrodes 15 and 25 are connected to the active layers 11 and 21 via control holes, and the planarization film 6 is formed.

The EL element 40, which is connected to the second TFT 20, can be formed by various methods. First, the anodes 41 contacting the drain electrodes 25 of the second TFT 20 are formed of Indium Tin Oxide (ITO) in a pattern, and the organic EL film 42 is formed on the anodes 41. The organic EL film 42 can, for example, be either a monomer or polymer organic film. A monomer organic EL film can be formed by stacking a hole injection layer, a hole transport layer, an organic EL layer, an electron injection layer, and an electron transport layer in a simple or complex structure. Various organic materials can be used, including Copper phthalocyanine (CuPc), N, N'-Di (naphthalene-1-yl)-N, N'-diphenyl-benzidine (NPB), and tris-8-hydroxyquinoline aluminum (Alq3). These monomer organic EL films are generally formed by vacuum deposition.

A polymer organic EL film can be made up of a hole transport layer (HTL) and a light emitting layer (EML). Here, the hole transport layer can be formed of PEDOT, and the light emitting layer can be formed of a polymer organic material, such as, poly-phenylenevinylene (PPV)-containing material and polyfluorence-containing material, by screen printing or Ink-jet printing.

After the formation of the organic EL film 42, the cathode 43 can be deposited of Al/Ca or the like on the entire surface of the organic EL film 42 or patterned. The cathode 43 is covered by a glass or metal cap.

The invention is not limited to the above-described organic EL display but can be applied to any displays capable of using TFTs as an image driving element, such as, liquid crystal displays or inorganic EL displays.

A flat panel display according to the invention, as described above, allows a white balance to be obtained even with active layers of the same size without change in the sizes of active layers of a TFT or in driving voltage.

Also, because an appropriate amount of current is supplied to individual sub-pixels, a proper level of luminance can be obtained, and degradation of the life span of the flat panel display can be prevented.

What is claimed is:

1. A flat panel display comprising:
   a plurality of pixels, each pixel including a plurality of sub-pixels, each sub-pixel comprising
      a self-luminescent element; and
      driving thin film transistors each driving transistor having a semiconductor active layer having a channel region connected to the self-luminescent elements of the sub-pixel to which the driving transistor belongs to supply current to each of the self-luminescent elements, wherein at least the channel regions of the semiconductor active layers have different crystal grains for different sub-pixels.

2. The flat panel display of claim 1, wherein there are sub-pixels for at least two different colors.

3. The flat panel display of claim 2, wherein the channel regions of the semiconductor active layers have different crystal grains for the sub-pixels associated with each of a plurality of different colors.

4. The flat panel display of claim 1, wherein the difference in the crystal grains between the channel regions is determined by an amount of current flowing in each of the sub-pixels, associated with each of a plurality of different colors.

5. The flat panel display of claim 1, wherein the difference in the crystal grains between the channel regions is determined by a current mobility value of each of the channel regions.

6. The flat panel display of claim 1, wherein the difference in the crystal grains between the channel regions is determined by a size of the crystal grains of each of the channel regions.

7. The flat panel display of claim 6, wherein the size of each of the crystal grains of each of the channel regions is proportional to an amount of current flowing in each of the sub-pixels of different colors when a substantially identical driving voltage is applied to the sub-pixels associated with each of a plurality of different colors.

8. The flat panel display of claim 6, wherein the size of each of the crystal grains of each of the channel regions is proportional to a current mobility value of each of the channel regions.

9. The flat panel display of claim 1, wherein the difference in the crystal grains between the channel regions is determined by a shape of the crystal grains of each of the channel regions.

10. The flat panel display of claim 9, wherein the shape of each of the crystal grains of each of the channel regions is determined so that at least the channel regions of sub-pixels in which a lowest amount of current flows at an identical driving voltage have shapeless grain boundaries.

11. The flat panel display of claim 10, wherein the shape of each of the crystal grains of each of the channel regions is determined so that at an identical driving voltage at least the channel regions of the sub-pixels in which a higher current flows than the amount of current flowing in sub-pixels with the shapeless grain boundaries have parallel primary grain boundaries in at least one strip and a rectangular shape and side grain boundaries of anisotropic grains extending approximately perpendicular to the primary grain boundaries and between adjacent primary grain boundaries.

12. The flat panel display of claim 9, wherein the shape of each of the crystal grains of each of the channel regions is determined so that at least the channel regions of sub-pixels in which a highest amount of current flows at a substantially identical driving voltage have parallel primary grain boundaries in strips and side grain boundaries of anisotropic grains extending approximately perpendicular to the primary grain boundaries and between adjacent primary grain boundaries.

13. The flat panel display of claim 9, wherein the shape of each of the crystal grains of each of the channel regions is determined so that at least the channel regions of sub-pixels having a lowest current mobility have shapeless grain boundaries.

14. The flat panel display of claim 13, wherein the shape of each of the crystal grains of each of the channel regions is determined so that at least the channel regions of sub-pixels with a current mobility higher than the sub-pixels having the shapeless grain boundaries have parallel primary grain boundaries in the shape of at least one strip and a rectangle and side grain boundaries of anisotropic grains extending approximately perpendicular to the primary grain boundaries and between adjacent primary grain boundaries.

15. The flat panel display of claim 9, wherein the shape of each of the crystal grains of each of the channel regions is determined so that at least the channel regions of sub-pixels with a highest current mobility have parallel primary grain boundaries in strips and side grain boundaries of anisotropic grains extending approximately perpendicular to the primary grain boundaries and between adjacent primary grain boundaries.

16. The flat panel display of claim 1, wherein at least the channel regions of the active layers are formed of polycrystalline silicon.

17. The flat panel display of claim 16, wherein the polycrystalline silicon is formed using a solidification method using laser.

18. A flat panel display comprising:
a plurality of pixels, each pixel including sub-pixels of red, green, and blue colors, each sub-pixel comprising a self-luminescent element; and
driving thin film transistors, each driving the film transistor having a semiconductor active layer with a channel region connected to the self-luminescent element of the sub-pixel to which the driving transistor belongs in order to supply current to each of the self-luminescent elements, wherein the channel regions of the semiconductor active layers have different crystal grains for the sub-pixels at least two different colors.

19. The flat panel display of claim 18, wherein the difference in the crystal grains between the channel regions is determined according to a size of each of the crystal grains of each of the channel regions.

20. The flat panel display of claim 19, wherein the size of each of the crystal grains of each of the channel regions is determined so that a current of a smallest value flows in the green sub-pixels.

21. The flat panel display of claim 19, wherein the size of each of the crystal grains of each of the channel regions is determined so that the value of current flowing in the sub-pixels decreases in the sequence of red, blue, and then green sub-pixels when an identical driving voltage is applied to the red sub-pixels, blue sub-pixels, and the green sub-pixels.

22. The flat panel display of claim 19, wherein the size of each of the crystal grains of each of the channel regions is determined so that the channel regions of the semiconductor active layers of the green sub-pixels have a smallest mobility value.

23. The flat panel display of claim 19, wherein the size of each of the crystal grains of each of the channel regions is determined so that the mobility values of the channel regions of the sub-pixels decrease in the sequence of red, blue, and then green sub-pixels.

24. The flat panel display of claim 19, wherein the size of each of the crystal grains of each of the channel regions decreases in the sequence of red, blue, and then green sub-pixels.

25. The flat panel display of claim 18, wherein the difference in the crystal grains between the channel regions is determined by a shape of the crystal grains of each of the channel regions.

26. The flat panel display of claim 25, wherein the shape of each of the crystal grains of each of the channel regions is determined so that a current of a smallest amount flows in the green sub-pixels.

27. The flat panel display of claim 25, wherein the shape of each of the crystal grains of each of the channel regions is determined so that the amount of current flowing in the sub-pixels decreases in the sequence of red sub-pixels, blue sub-pixels, and then the green sub-pixels when an identical driving voltage is applied to the red sub-pixels, the blue sub-pixels, and the green sub-pixels.

28. The flat panel display of claim 25, wherein the shape of each of the crystal grains of each of the channel regions is determined so that the channel regions of the semiconductor active layers of the green sub-pixels have a smallest mobility value.

29. The flat panel display of claim 25, wherein the shape of each of the crystal grains of each of the channel regions is determined so that the mobility values of the channel regions of the sub-pixels decrease in the sequence of the red sub-pixels, the blue sub-pixels, and then the green sub-pixels.

30. The flat panel display of claim 25, wherein the crystal grains of at least the channel regions of the red sub-pixels among all of the channel regions of the sub-pixels have parallel primary grain boundaries and side grain boundaries of anisotropic grains extending approximately perpendicular to the primary grain boundaries and between adjacent primary grain boundaries, and the primary grain boundaries are in the shape of strips perpendicular to the lengthwise of the active layers of the red sub-pixels.

31. The flat panel display of claim 25, wherein at least the channel regions of the green sub-pixels among the channel regions of all of the sub-pixels have shapeless grain boundaries.

32. The flat panel display of claim 25, wherein at least the channel regions of the blue sub-pixels among the channel regions of all of the sub-pixels have parallel primary grain boundaries in a rectangular shape and side grain boundaries of anisotropic grains extending approximately perpendicular to the primary grain boundaries and between adjacent primary grain boundaries.

33. The flat panel display of claim 18, wherein at least the channel regions of the semiconductor active layers are formed of polycrystalline silicon.

34. The flat panel display of claim 33, wherein the polycrystalline silicon is formed using a solidification method using laser.

* * * * *